(12) United States Patent
Ali et al.

(10) Patent No.: US 10,566,200 B2
(45) Date of Patent: Feb. 18, 2020

(54) METHOD OF FABRICATING TRANSISTORS, INCLUDING AMBIENT OXIDIZING AFTER ETCHINGS INTO BARRIER LAYERS AND ANTI-REFLECTING COATINGS

(71) Applicant: TEXAS INSTRUMENTS INCORPORATED, Dallas, TX (US)

(72) Inventors: Abbas Ali, Plano, TX (US); Binghua Hu, Plano, TX (US); Stephanie L. Hilbun, Garland, TX (US); Scott William Jessen, Allen, TX (US); Ronald Chin, Dallas, TX (US); Jarvis Benjamin Jacobs, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/944,550

(22) Filed: Apr. 3, 2018

(65) Prior Publication Data
US 2019/0304786 A1  Oct. 3, 2019

(51) Int. Cl.
*H01L 21/266* (2006.01)
*H01L 29/66* (2006.01)

(52) U.S. Cl.
CPC ........ *H01L 21/266* (2013.01); *H01L 29/6659* (2013.01)

(58) Field of Classification Search
CPC . H01L 21/76; H01L 21/7607; H01L 21/7621; H01L 21/266; H01L 29/6659;
(Continued)

(56) References Cited

U.S. PATENT DOCUMENTS 4,040,168 A     8/1977  Huang
5,512,495 A  *  4/1996  Mei .................... H01L 29/0847
                                                    438/286
(Continued)

FOREIGN PATENT DOCUMENTS

EP         2479790 A2    7/2012
KR    1020060070334 A    6/2006

OTHER PUBLICATIONS

PCT Search Report for Application No. PCT/US 2019/025599, dated Jul. 11, 2019.

*Primary Examiner* — Sonya D. McCall-Shepard
(74) *Attorney, Agent, or Firm* — Andrew R. Ralston; Charles A. Brill; Frank D. Cimino

(57) ABSTRACT

A method to fabricate a transistor comprises: forming a first dielectric layer on a semiconductor substrate; depositing a barrier layer on the first dielectric layer; depositing an anti-reflective coating on the barrier layer; depositing and exposing a pattern in a photoresist layer to radiation followed by etching to provide an opening; etching a portion of the anti-reflective coating below the opening; etching a portion of the barrier layer below the opening to expose a portion of the first dielectric layer; providing an ambient oxidizing agent to grow an oxide region followed by removing the barrier layer; implanting dopants into the semiconductor substrate after removing the barrier layer; removing the first dielectric layer after implanting dopants into the semiconductor substrate; and forming a second dielectric layer after removing the first dielectric layer, wherein the oxide region is grown to be thicker than the second dielectric layer.

20 Claims, 4 Drawing Sheets

(58) Field of Classification Search
CPC ........... H01L 29/66659; H01L 29/7835; H01L 29/42368
See application file for complete search history.

(56) References Cited

U.S. PATENT DOCUMENTS 6,121,133 A * 9/2000 Iyer .................... G03F 7/091
   257/E21.029
2006/0003518 A1  1/2006 Harter et al.
2010/0270614 A1* 10/2010 Croce ............... H01L 29/42368
   257/337

* cited by examiner

US 10,566,200 B2

METHOD OF FABRICATING TRANSISTORS, INCLUDING AMBIENT OXIDIZING AFTER ETCHINGS INTO BARRIER LAYERS AND ANTI-REFLECTING COATINGS

BACKGROUND

In many applications, it is desirable to fabricate transistors having a relatively low specific resistance. For some field-effect-transistors, such as drain-extended metal-oxide-semiconductor (DEMOS) transistors, increasing the oxide thickness over part of the gate oxide may lower specific resistance.

SUMMARY

In accordance with at least one example of the disclosure, a method to fabricate a transistor comprises: forming a first dielectric layer on a semiconductor substrate; depositing a barrier layer on the first dielectric layer; depositing an anti-reflective coating on the barrier layer; depositing a photoresist layer; exposing a pattern in the photoresist layer to radiation; etching the photoresist layer according to the pattern to provide an opening in the photoresist layer; etching a portion of the anti-reflective coating below the opening in the photoresist layer; etching a portion of the barrier layer below the opening to expose a portion of the first dielectric layer; providing an ambient oxidizing agent after etching the portion of the barrier layer below the opening to grow an oxide region; removing the barrier layer after providing the ambient oxidizing agent; implanting dopants into the semiconductor substrate after removing the barrier layer; removing the first dielectric layer after implanting dopants into the semiconductor substrate; and forming a second dielectric layer after removing the first dielectric layer, wherein the oxide region is grown to be thicker than the second dielectric layer.

In accordance with at least one example of the disclosure, a method to fabricate a transistor comprises: forming a sacrificial oxide layer on a semiconductor substrate; depositing a silicon nitride layer on the sacrificial oxide layer; depositing an anti-reflective coating on the silicon nitride layer; depositing a photoresist layer; exposing a pattern in the photoresist layer to radiation; etching the photoresist layer according to the pattern to provide an opening in the photoresist layer; etching a portion of the anti-reflective coating below the opening; etching a portion of the silicon nitride layer below the opening to expose a portion of the sacrificial oxide layer; and growing an oxide region on the exposed portion of the sacrificial oxide layer; removing the silicon nitride layer after growing the oxide region; implanting dopants into the semiconductor substrate after removing the silicon nitride layer; removing the sacrificial oxide layer after implanting dopants into the semiconductor substrate; and forming a gate oxide layer on the semiconductor substrate after removing the sacrificial oxide layer, wherein the oxide region is grown to thickness greater than a thickness of the gate oxide layer.

In accordance with at least one example of the disclosure, a method to fabricate a transistor comprises: forming a sacrificial oxide layer on a semiconductor substrate; depositing a silicon nitride layer on the sacrificial oxide layer; depositing a photoresist layer; exposing a pattern in the photoresist layer to radiation; etching the photoresist layer according to the pattern to provide an opening in the photoresist layer; etching a portion of the silicon nitride layer below the opening to expose a portion of the sacrificial oxide layer; growing an oxide region of at least 400 angstroms thick on the exposed portion of the sacrificial oxide layer; removing the silicon nitride layer after growing the oxide region; implanting dopants into the semiconductor substrate after removing the silicon nitride layer to form a drain region in the semiconductor substrate; removing the sacrificial oxide layer after implanting dopants into the semiconductor substrate; and forming a gate oxide layer on the semiconductor substrate after removing the sacrificial oxide layer, the gate oxide layer having a thickness less than 400 angstroms.

BRIEF DESCRIPTION OF THE DRAWINGS

For a detailed description of various examples, reference will now be made to the accompanying drawings in which.

DETAILED DESCRIPTION

In accordance with the disclosed embodiments, a method to fabricate transistors, such as for example a DEMOS transistor, includes growing a thick oxide below the transistor gate, where the process steps can be incorporated into a standard bipolar complementary-metal-oxide-semiconductor (BiCMOS) process flow.

Figure 1:
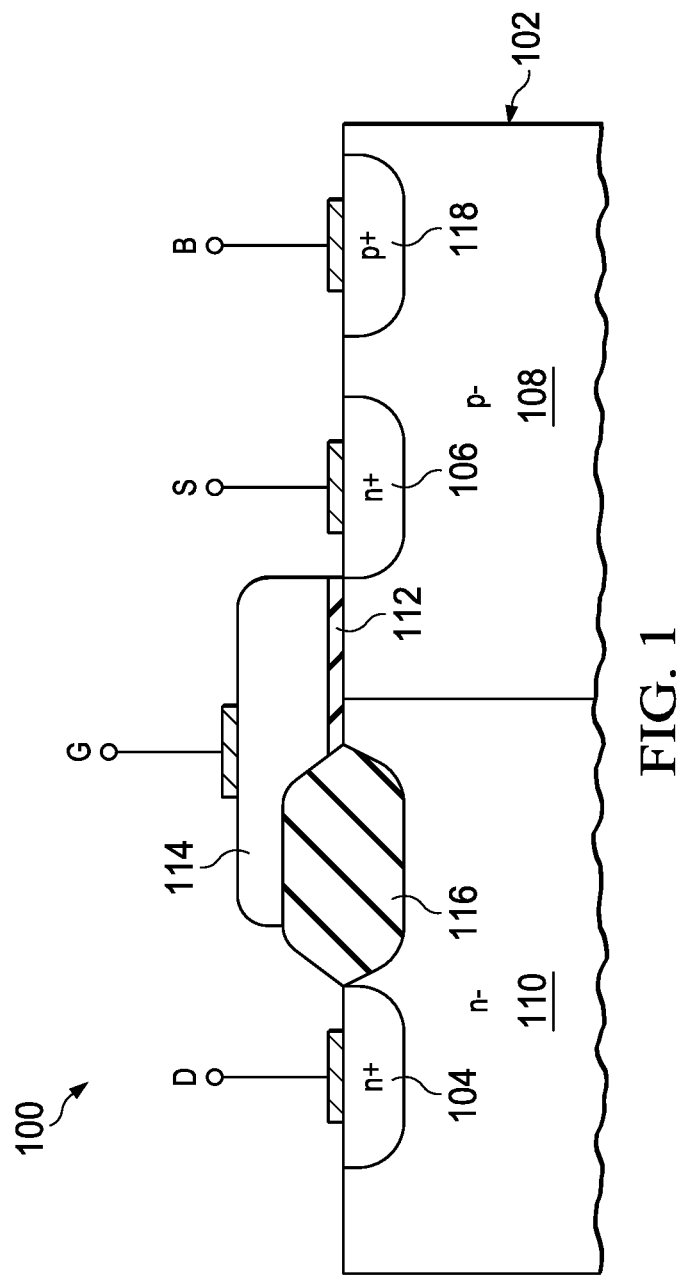
FIG. 1 shows a transistor in accordance with various examples.

FIG. 1 shows a cross-sectional view of an illustrative transistor 100, not drawn to scale. In the example of FIG. 1, the illustrative transistor 100 is a DEMOS transistor. Formed in a semiconductor substrate 102 is a drain region 104 and a source region 106. In the particular example of FIG. 1, the semiconductor substrate 102 is a silicon crystal, and the illustrative transistor 100 is an n-type DEMOS transistor, where the drain region 104 and the source region 106 are each highly doped n-type regions. The source region 106 is formed within a lightly doped p-type well 108, and the drain region 104 is extended by way of the lightly doped n-type region 110.

A dielectric layer 112 is formed on the semiconductor substrate 102. The dielectric layer 112 is usually silicon dioxide, and the dielectric layer 112 will be referred to as a gate oxide layer 112. A gate 114 is formed over the gate oxide layer 112. The gate 114 may comprise polysilicon. An oxide region 116 is grown on and into the semiconductor substrate 102. The oxide region 116 is adjacent to the drain region 104 and is below the gate 114, and the oxide region 116 is thicker than the dielectric layer 112. The oxide region 116 may comprise silicon dioxide. The presence of the oxide region 116 provides a lift-up to the gate 114. A highly doped p-type region 118 serves as a body contact for the illustrative transistor 100.

When the illustrative transistor 100 is ON so that the channel below the gate 114 is in an inversion mode, a channel current of majority carriers (e.g., electrons for an n-type channel) flows from the source region 106 to the drain region 104. The presence of the oxide region 116 affects the path of the channel current. The relatively large depth of the oxide region 116 into the channel forces the majority carriers of the channel current to accelerate as they move underneath the oxide region 116 and toward the drain region 104. The acceleration of the majority carriers helps to reduce the specific resistance of the illustrative transistor 100.

The oxide region 116 may be employed in other types of transistors, such as for example a double-diffusion metal-oxide-semiconductor (DMOS) transistor, as well as other types of lateral or vertical transistors. Although not shown in FIG. 1, other semiconductor devices may be formed in the semiconductor substrate 102 and coupled to the illustrative transistor 100 to realize various circuits. In some embodiments in which other semiconductor devices are integrated with the illustrative transistor 100, a silicon trench isolation (STI) region is formed around the illustrative transistor 100 to provide electrical isolation from other semiconductor devices.

Figure 2:
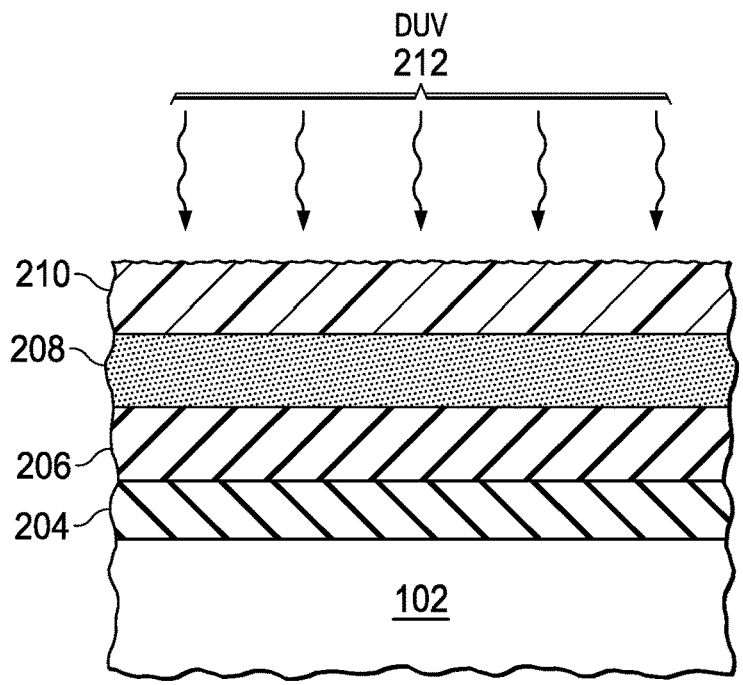
FIG. 2 shows a semiconductor substrate with several layers in accordance with various examples.

FIG. 2 shows a cross-sectional view (not drawn to scale) of the semiconductor substrate 102 and several layers formed during part of a process flow according to embodiments. A sacrificial dielectric layer 204 is formed over the semiconductor substrate 102. In silicon technology, the sacrificial dielectric layer 204 typically comprises silicon dioxide, and will be referred to as a sacrificial oxide layer 204. A barrier layer 206, typically silicon nitride, is deposited on the sacrificial oxide layer 204. A bottom antireflective coating (BARC) 208 is deposited on the barrier layer 206, and a photoresist layer 210 is deposited on the BARC 208.

The photoresist layer 210 is exposed to radiation according to an illumination pattern defined by a mask (not shown). The pattern illuminated on the photoresist layer 210 defines an opening for growing the oxide region 116 of FIG. 1. In the example of FIG. 2, arrows, such as for example an arrow 212, pictorially represent the radiation. In some embodiments, the radiation may be in the deep ultraviolet (DUV) region, such as, for example, a wavelength of 248 nm, or a wavelength of 193 nm for an argon fluoride excimer laser source. As process technology nodes move to smaller sizes, embodiments may utilize other types of illumination sources and masks, such as for example extreme ultraviolet (EUC) lasers used with reflective masks (not shown).

FIG. 2 does not show all features formed within and on the semiconductor substrate 102. For example, buried layers and STI regions may be formed to electrically isolate various devices formed within and on the semiconductor substrate 102.

Figure 3:
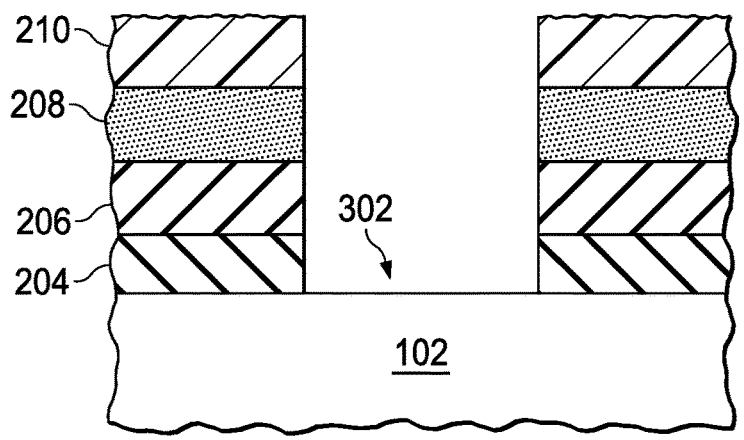
FIG. 3 shows a silicon substrate after etching in accordance with various examples.

FIG. 3 shows a cross-sectional view (not drawn to scale) of the silicon substrate 102, with the layers of FIG. 2, after etching is performed to provide an opening 302, according to embodiments. The etching may include plasma reactive-ion etching (RIE). The plasma RIE may be performed in a gas mixture of oxygen ($O_2$), a carrier gas (e.g., argon), or fluorocarbons comprising carbon (C), Hydrogen (H), and Fluorine (F) having a stoichiometry CxHyFz with x=1 or 2; y=0, 1, 2, 3, or 4; and z=1, 2, 3, or 4.

Figure 4:
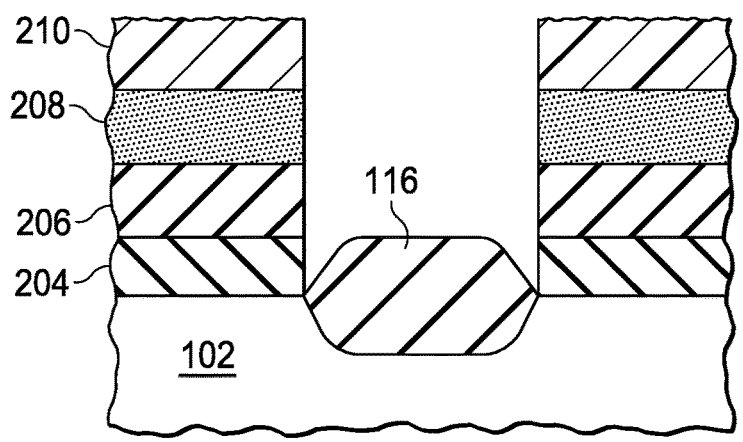
FIG. 4 shows a silicon substrate with an oxide region in accordance with various examples.

FIG. 4 shows a cross-sectional view (not drawn to scale) of the silicon substrate 102, with the layers of FIG. 3, where the oxide region 116 has been grown, according to embodiments. For some embodiments, the oxide region 116 may have a thickness of at least 400 angstroms, for example in the range of 400 angstroms to 4000 angstroms. The semiconductor substrate 102 is exposed to an ambient oxidizing agent to grow the oxide region 116. For some embodiments, the ambient oxidizing is performed in a thermal furnace oxidation process using oxygen and/or steam. For some embodiments, the semiconductor substrate 102 is exposed to oxygen and/or steam at a temperature above 900° C., for example in the range of 950° C. to 1000° C.

The thickness of the barrier layer 206 affects formation of the "bird's beak" (also sometimes referred to as a "birds beak") shape of the oxide region 116 because of lateral oxidation under the barrier layer 206. The thickness of the barrier layer 206 may have a thickness from 300 angstroms to 1000 angstroms. In some embodiments, the barrier layer 206 may be about 950 angstroms thick.

After forming the oxide region 116, the various layers (excluding the oxide region 116) above the semiconductor substrate 102 illustrated in FIG. 4 are removed, followed by additional process steps to fabricate a transistor, such the illustrative transistor 100 of FIG. 1. For example, dopants can be implanted to form the lightly doped n-type region 110, the drain region 104, and the source region 106. The sacrificial oxide layer 204 is removed before growing the gate oxide layer 112, and the gate 114 is formed over the gate oxide layer 112.

Figure 5:
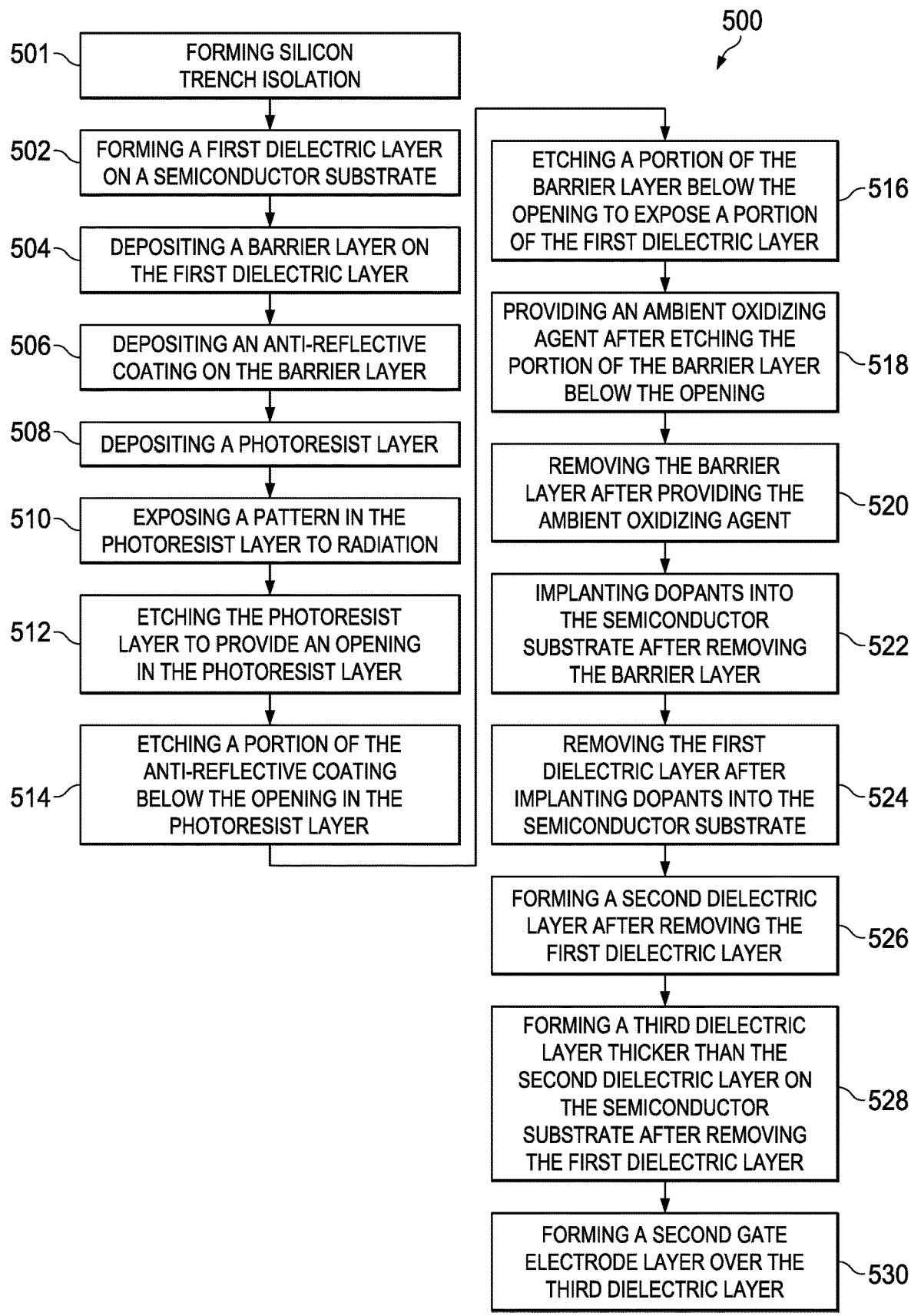
FIG. 5 shows a process flow in accordance with various examples.

FIG. 5 shows an illustrative process flow 500. The illustrative process flow 500 includes, in step 501, formation of one or more STI regions; in step 502, forming a first dielectric layer (e.g., the sacrificial oxide layer 204) on a semiconductor substrate (e.g., the semiconductor substrate 102); in step 504, depositing a barrier layer 206 (e.g., a silicon nitride layer) on the first dielectric layer; in step 506, depositing an anti-reflective coating (e.g., the BARC 208) on the barrier layer; in step 508, depositing a photoresist layer (e.g., the photoresist layer 210); in step 510, exposing a pattern in the photoresist layer to radiation; in step 512, etching the photoresist layer according to the pattern to provide an opening in the photoresist layer; in step 514, etching a portion of the anti-reflective coating below the opening in the photoresist layer; in step 516, etching a portion of the barrier layer below the opening to expose a portion of the first dielectric layer; in step 518, providing an ambient oxidizing agent after etching the portion of the barrier layer below the opening, thereby forming an oxide region, e.g. the oxide region 116; in step 520, removing the barrier layer after providing the ambient oxidizing agent; in step 522, implanting dopants into the semiconductor substrate after removing the barrier layer (e.g., to form the drain region 104 or the source region 106); in step 524, removing the first dielectric layer after implanting dopants into the semiconductor substrate; and in step 526, forming a second dielectric layer (e.g., the gate oxide layer 112) after removing the first dielectric layer. A gate electrode, e.g. the gate 114, may be formed over the second dielectric layer 112 and the oxide region 116.

The process steps in fabricating a transistor according to embodiments (e.g., the process flow 500) can be incorporated into a standard process flow, for example, a standard BiCMOS process, or a linear BiCMOS (LBC) process. Additional process steps may be performed prior to and after the process steps in an embodiment, such as the process steps described with respect to FIG. 5. For example, implanting dopants into the semiconductor substrate 102 to form buried regions may be performed prior to the process flow 500. As another example, an epitaxial layer may be grown on the semiconductor substrate 102 prior to the process flow 500.

Some or all of the steps illustrated in FIG. 5 may be repeated when fabricating multiple devices on a wafer. For example, step 526 (and steps related to step 526) may be repeated to fabricate multiple transistors having different thicknesses for their respective gate oxide layers. As a specific example, the dielectric layer formed in an iteration of step 526 may have a thickness of about 40 angstroms, so that one or more transistors are fabricated having a gate oxide layer of about 40 angstroms. In another iteration of step 526, the dielectric layer may have a thickness of about 100 angstroms, so that one or more transistors are fabricated having a gate oxide layer of about 100 angstroms, suitable for a higher operating voltage. The second iteration of the step 526 is reflected in FIG. 5 as a step 528, in which the thicker gate oxide layer may is referred to as a third dielectric layer. (See gate oxide layer 612 in FIG. 6.) In a step 530 a second gate electrode, e.g. the gate 614 (FIG. 6), may be formed over the third dielectric layer 612 and the second gate electrode 616.

Figure 6:
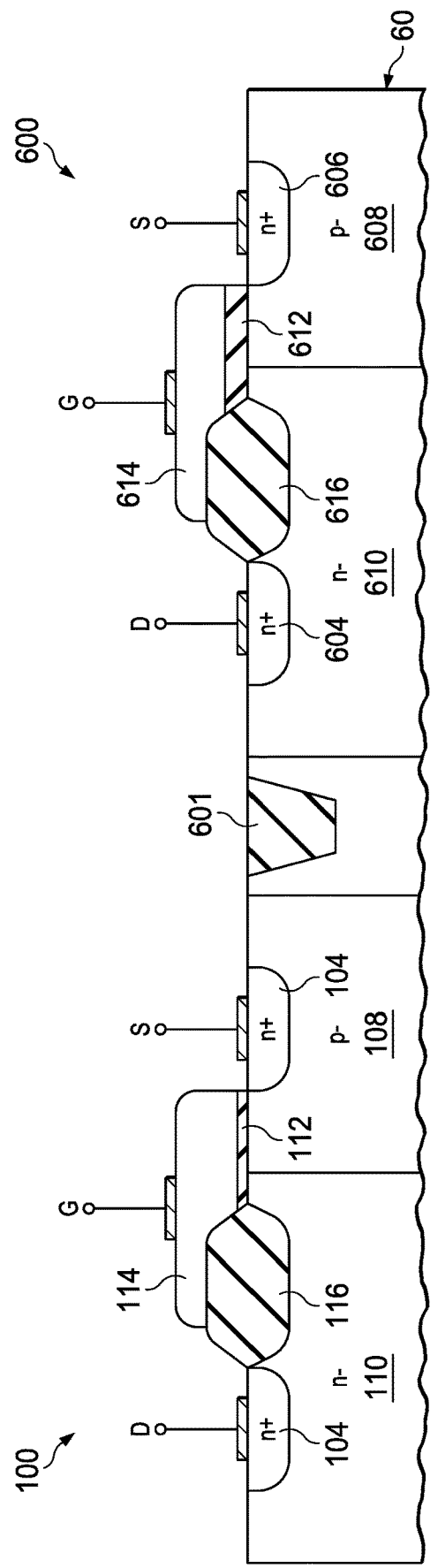
FIG. 6 shows two transistors in accordance with various examples.

FIG. 6 shows a cross-sectional view (not drawn to scale) of two illustrative transistors. FIG. 6 shows a semiconductor substrate 602 in which the illustrative transistor 100 is formed, but where the highly doped p-type region 118 (body contact) is not shown. Formed in the semiconductor substrate 602 is an illustrative transistor 600 (with its body contact not shown). An STI region 601 isolates the illustrative transistor 100 from the illustrative transistor 600.

The illustrative transistor 600 comprises a drain region 604 and a source region 606. In the particular example of FIG. 6, the illustrative transistor 600 is an n-type DEMOS transistor, where the drain region 604 and the source region 606 are each highly doped n-type regions. The source region 606 is formed within a lightly doped p-type well 608, and the drain region 604 is extended by way of the lightly doped n-type region 610.

A gate oxide layer (a dielectric layer) 612 is formed on the semiconductor substrate 602. A gate 614 is formed over the gate oxide layer 612. An oxide region 616 is grown on and into the semiconductor substrate 602. The oxide region 616 is adjacent to the drain region 604 and is below the gate 614, and the oxide region 616 is thicker than the gate oxide layer 612. The gate oxide layer 612 is thicker than the gate oxide layer 112, so that the illustrative transistor 600 can withstand a higher operating voltage than the illustrative transistor 100.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A method to fabricate a transistor, the method comprising:
   forming a first dielectric layer of silicon dioxide having a first thickness on a semiconductor substrate;
   depositing a barrier layer on the first dielectric layer;
   depositing an anti-reflective coating on the barrier layer;
   depositing a photoresist layer;
   exposing a pattern in the photoresist layer to radiation;
   etching the photoresist layer according to the pattern to provide an opening in the photoresist layer;
   etching a portion of the anti-reflective coating below the opening in the photoresist layer;
   etching a portion of the barrier layer below the opening to expose a portion of the first dielectric layer;
   providing an ambient oxidizing agent after etching the portion of the barrier layer below the opening to grow an oxide region by selectively increasing the first thickness of the exposed portion of the first dielectric layer to a greater second thickness;
   removing the barrier layer after providing the ambient oxidizing agent;
   implanting dopants into the semiconductor substrate after removing the barrier layer;
   removing the first dielectric layer outside a lateral extent of the oxide region after implanting dopants into the semiconductor substrate, the removing forming exposed portions of the semiconductor substrate;
   forming a second dielectric layer of silicon dioxide having a third thickness on the exposed portions of the semiconductor substrate after removing the first dielectric layer, wherein the second thickness of the oxide region is greater than the third thickness of the second dielectric layer; and
   forming a gate electrode over the oxide region and the second dielectric layer.

2. The method of claim 1, wherein the gate electrode is a first gate electrode, and further comprising:
   forming a third dielectric layer of silicon dioxide on the semiconductor substrate, wherein the third dielectric layer is thicker than the second dielectric layer; and
   forming a second gate electrode layer over the third dielectric layer.

3. The method of claim 1, wherein providing the ambient oxidizing agent comprises exposing the semiconductor substrate to the ambient oxidizing agent at a temperature above 900° C.

4. The method of claim 1, wherein the oxidizing agent comprises oxygen or steam.

5. The method of claim 1, wherein providing the ambient oxidizing agent comprises growing the oxide region into and on the semiconductor substrate to a thickness of at least 400 angstroms.

6. The method of claim 1, wherein the barrier layer has a thickness between 300 angstroms and 1000 angstroms.

7. The method of claim 1, wherein the barrier layer comprises silicon nitride.

8. The method of claim 1, wherein etching the portions of the anti-reflective coating and the barrier layer below the opening comprises plasma reactive-ion etching (ME).

9. The method of claim 8, wherein the plasma RIE includes using a gas mixture of oxygen (02), a carrier gas, or fluorocarbons comprising carbon (C), Hydrogen (H), and Fluorine (F) having a stoichiometry CxHyFz with x=1 or 2; y=0, 1, 2, 3, or 4; and z=1, 2, 3, or 4.

10. The method of claim 9, wherein the carrier gas comprises argon.

11. The method of claim 7, wherein the barrier layer comprises silicon nitride having a thickness between 300 angstroms and 1000 angstroms.

12. The method of claim 1, wherein providing the ambient oxidizing agent comprises growing the oxide region into and on the semiconductor substrate, the oxide region having a thickness of at least 400 angstroms.

13. A method to fabricate a transistor, the method comprising:
   forming a sacrificial oxide layer on a semiconductor substrate;
   depositing a silicon nitride layer on the sacrificial oxide layer;
   depositing an anti-reflective coating on the silicon nitride layer;
   depositing a photoresist layer;
   exposing a pattern in the photoresist layer to radiation;

etching the photoresist layer according to the pattern to provide an opening in the photoresist layer;

etching a portion of the anti-reflective coating below the opening;

etching a portion of the silicon nitride layer below the opening to expose a portion of the sacrificial oxide layer; and forming an oxide region by increasing a thickness of the exposed portion of the sacrificial oxide layer;

removing the silicon nitride layer after growing the oxide region;

implanting dopants into the semiconductor substrate after removing the silicon nitride layer;

removing the sacrificial oxide layer outside a lateral extent of the oxide region after implanting dopants into the semiconductor substrate, the removing of the sacrificial oxide layer exposing portions of the semiconductor substrate; and forming a gate oxide layer on the exposed portions of the semiconductor substrate after removing the sacrificial oxide layer, wherein the oxide region is grown to thickness greater than a thickness of the gate oxide layer.

14. The method of claim 13, wherein forming the oxide region comprises increasing the thickness of the oxide region to at least 400 angstroms.

15. The method of claim 1, wherein the second thickness is at least 40 nm and the third thickness is less than 40 nm.

16. A method of forming an integrated circuit, comprising:

forming a first oxide layer on a semiconductor substrate, and a barrier layer over the first oxide layer;

forming an opening within the barrier layer, thereby exposing an exposed portion of the first oxide layer;

thermally oxidizing the semiconductor substrate under the exposed portion of the first oxide layer, thereby increasing a thickness of the exposed portion to a first thickness;

implanting a dopant into the semiconductor substrate through the first oxide layer;

removing the first oxide layer outside the exposed portion of the first oxide layer, thereby exposing a second portion of the semiconductor substrate;

forming a second oxide layer having a second thickness on the second portion, the first thickness being greater than the second thickness.

17. The method of claim 16, wherein the first thickness is at least 40 nm and the second thickness is less than 40 nm.

18. The method of claim 16, further forming a gate electrode over the thermal oxide and the second oxide layer.

19. The method of claim 16, wherein the barrier layer comprises silicon nitride.

20. The method of claim 16, wherein thermally oxidizing the semiconductor substrate under the exposed portion of the first oxide layer includes oxidation in an oxygen or steam ambient.

* * * * *